(12) United States Patent
Fan et al.

(10) Patent No.: US 7,247,526 B1
(45) Date of Patent: *Jul. 24, 2007

(54) PROCESS FOR FABRICATING AN INTEGRATED CIRCUIT PACKAGE

(75) Inventors: Chun Ho Fan, Tsuen Wan (HK); Neil McLellan, Danville, CA (US); Wing Him Lau, Yuen Long (HK); Emily Shui Ming Tse, Sai Wan Ho (HK)

(73) Assignee: ASAT Ltd., Tsuen Wan New Territories (HK)

( * ) Notice: Subject to any disclaimer, the term of this patent is extended or adjusted under 35 U.S.C. 154(b) by 20 days.

This patent is subject to a terminal disclaimer.

(21) Appl. No.: 11/137,973

(22) Filed: May 25, 2005

Related U.S. Application Data

(63) Continuation-in-part of application No. 10/765,192, filed on Jan. 28, 2004, now Pat. No. 7,049,177, and a continuation-in-part of application No. 09/802,678, filed on Mar. 9, 2001, now Pat. No. 6,933,594, which is a continuation-in-part of application No. 09/288,352, filed on Apr. 8, 1999, now Pat. No. 6,498,099, which is a continuation-in-part of application No. 09/095,803, filed on Jun. 10, 1998, now Pat. No. 6,229,200.

(51) Int. Cl.
*H01L 21/00* (2006.01)
(52) U.S. Cl. ...................... 438/123; 438/111
(58) Field of Classification Search ............. 438/111, 438/112, 113, 123, 124, 127
See application file for complete search history.

(56) References Cited

U.S. PATENT DOCUMENTS 4,530,152 A    7/1985  Roche et al.
4,685,998 A    8/1987  Quinn et al.
5,066,831 A   11/1991  Spielerger et al.

(Continued)

FOREIGN PATENT DOCUMENTS

JP          59-208756       11/1984

(Continued)

OTHER PUBLICATIONS

Neil McLellan et al.; "Leadless Plastic Chip Carrier With Etch Back Pad Singulation"; U.S. Appl. No. 09/802,678, filed on Mar. 29, 2001; currently pending.

(Continued)

*Primary Examiner*—S. V. Clarak
(74) *Attorney, Agent, or Firm*—Morrison & Foerster LLP

(57) ABSTRACT

A process for fabricating an integrated circuit package. At least a first side of a leadframe strip is selectively etched to define portions of a die attach pad and at least one row of contacts adjacent the die attach pad. A carrier strip is laminated to the first side of the leadframe strip and a second side of the leadframe strip is selectively etched to thereby define a remainder of the die attach pad and the at least one row of contacts. A semiconductor die is mounted to the die attach pad, on the second side of the leadframe strip and the semiconductor die is wire bonded to ones of the contacts. The second side of the leadframe strip is encapsulating, including the semiconductor die and wire bonds, in a molding material. The carrier strip is removed from the leadframe strip and the integrated circuit package is singulated from a remainder of the leadframe strip.

14 Claims, 12 Drawing Sheets

U.S. PATENT DOCUMENTS

| | | | |
|---|---|---|---|
| 5,293,072 A | 3/1994 | Tsuji et al. | |
| 5,444,301 A | 8/1995 | Song et al. | |
| 5,457,340 A | 10/1995 | Templeton, Jr. et al. | |
| 5,710,695 A | 1/1998 | Manteghi | |
| 5,777,382 A | 7/1998 | Abbott et al. | |
| 5,900,676 A | 5/1999 | Kweon et al. | |
| 5,976,912 A | 11/1999 | Fukutomi et al. | |
| 6,001,671 A | 12/1999 | Fjelstad | |
| 6,057,601 A | 5/2000 | Lau et al. | |
| 6,081,029 A | 6/2000 | Yamaguchi | |
| 6,093,584 A | 7/2000 | Fjelstad | |
| 6,194,786 B1 | 2/2001 | Orcutt | |
| 6,229,200 B1 | 5/2001 | McLellan et al. | |
| 6,238,952 B1 | 5/2001 | Lin | |
| 6,294,830 B1 | 9/2001 | Fjelstad | |
| 6,306,685 B1 | 10/2001 | Liu et al. | |
| 6,459,163 B1 | 10/2002 | Bai | |
| 6,498,099 B1 * | 12/2002 | McLellan et al. | 438/689 |
| 6,528,877 B2 | 3/2003 | Ernst et al. | |
| 6,545,347 B2 | 4/2003 | McLellan | |
| 6,585,905 B1 | 7/2003 | Fan et al. | |
| 6,586,677 B2 | 7/2003 | Glenn | |
| 6,635,957 B2 | 10/2003 | Kwan et al. | |
| 6,683,368 B1 * | 1/2004 | Mostafazadeh | 257/676 |
| 6,740,961 B1 * | 5/2004 | Mostafazadeh | 257/676 |
| 6,777,265 B2 * | 8/2004 | Islam et al. | 438/111 |
| 6,821,821 B2 | 11/2004 | Fjelstad | |
| 6,841,414 B1 * | 1/2005 | Hu et al. | 438/106 |
| 6,946,324 B1 * | 9/2005 | McLellan et al. | 438/111 |
| 6,955,942 B2 * | 10/2005 | Kobayashi et al. | 438/106 |
| 6,975,038 B1 * | 12/2005 | Mostafazadeh | 257/780 |
| 6,989,294 B1 * | 1/2006 | McLellan et al. | 438/111 |
| 7,033,866 B2 * | 4/2006 | Chow et al. | 438/123 |
| 2002/0074672 A1 * | 6/2002 | Huang et al. | 257/788 |
| 2003/0015780 A1 | 1/2003 | Kang et al. | |
| 2006/0157831 A1 * | 7/2006 | Ano | 257/676 |
| 2006/0170081 A1 * | 8/2006 | Gerber et al. | 257/666 |

OTHER PUBLICATIONS

Chun Ho Fan et al; "Leadless Plastic Chip Carrier With Standoff Contacts and Die Attach Pad"; U.S. Appl. No. 10/765,192, filed on Jan. 28, 2004; currently pending.

\* cited by examiner

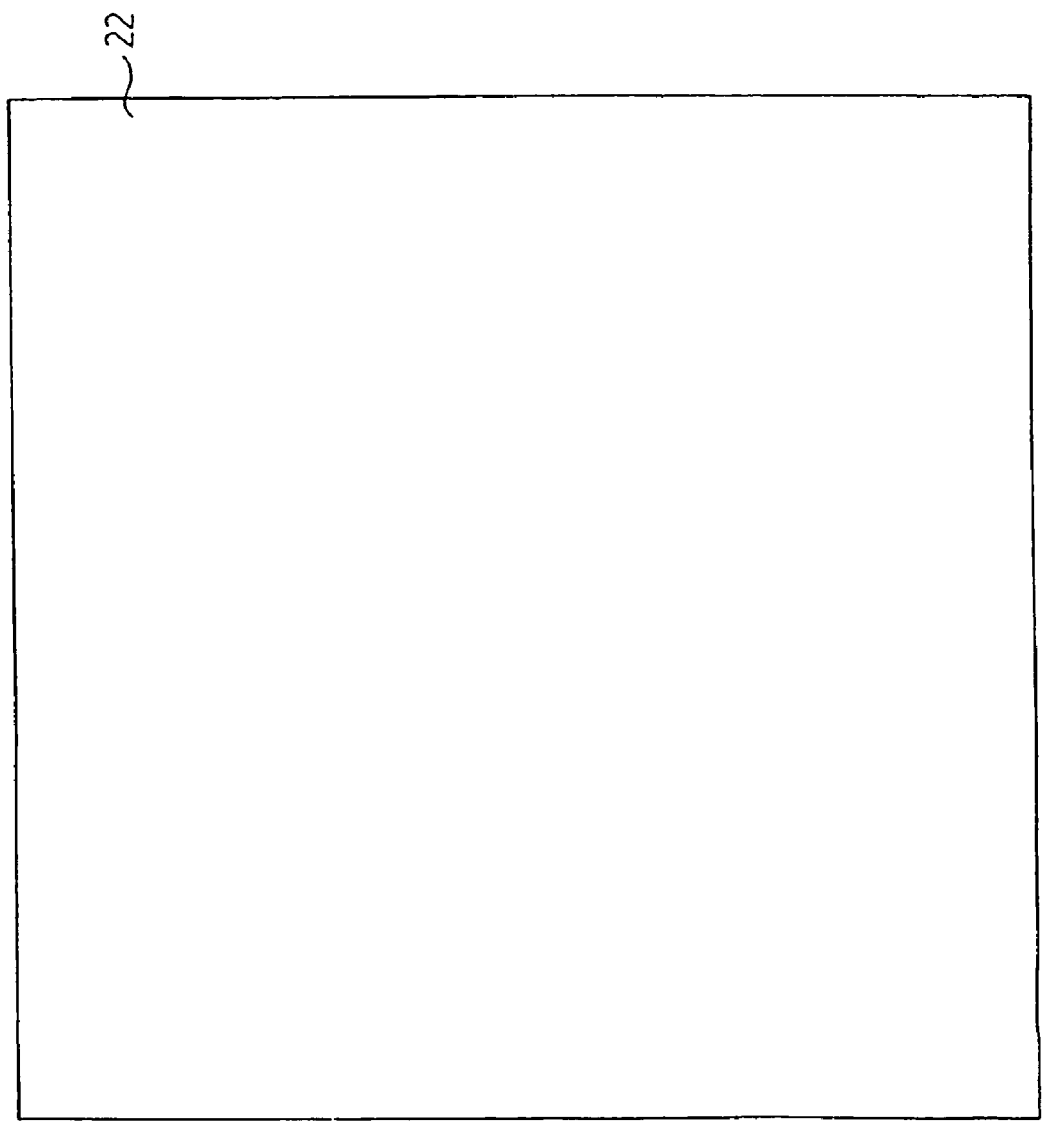

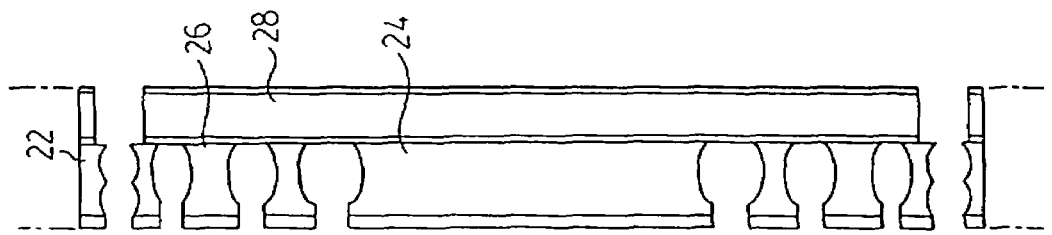
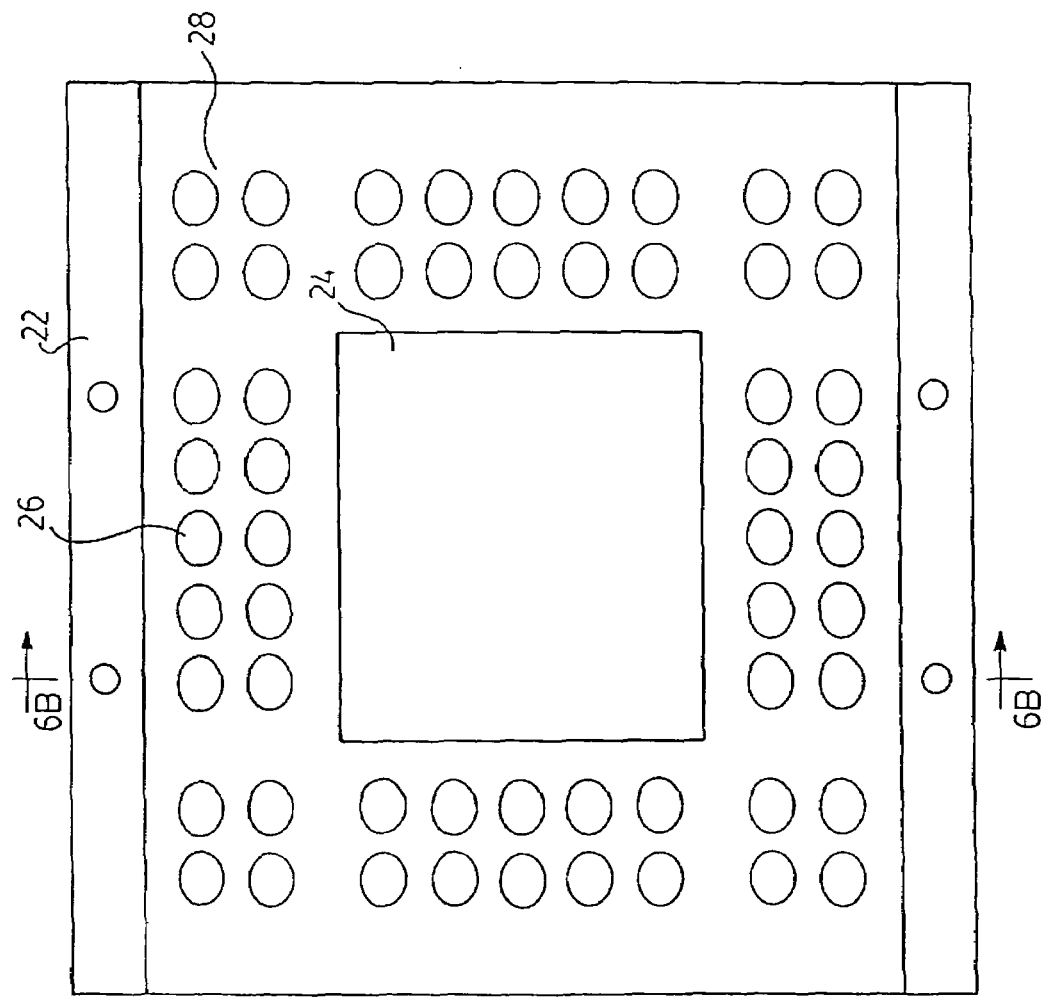
FIG. 6B.
FIG. 6A.

PROCESS FOR FABRICATING AN INTEGRATED CIRCUIT PACKAGE

CROSS-REFERENCE TO RELATED APPLICATIONS

This is a continuation-in-part of U.S. patent application Ser. No. 10/765,192, filed Jan. 28, 2004, now U.S. Pat. No. 7,049,177 entitled Leadless Plastic Chip Carrier with Stand-off Contacts and Die Attach Pad and a continuation-in-part of U.S. patent application Ser. No. 09/802,678, filed Mar. 9, 2001, now U.S. Pat. No. 6,933,594 which is a continuation-in-part of U.S. patent application Ser. No. 09/288,352, filed Apr. 8, 1999 now U.S. Pat. No. 6,498,099, issued Dec. 24, 2002, which is a continuation-in-part of U.S. patent application Ser. No. 09/095,803 filed Jun. 10, 1998, now U.S. Pat. No. 6,299,200, issued May 8, 2001.

FIELD OF THE INVENTION

The present invention relates in general to integrated circuit packaging and more particularly to an improved process for fabricating an integrated circuit package, that includes unique features that allow gang testing of integrated circuit packages and etching to provide mold interlock.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a motherboard, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die attach pad (paddle) and leadframe inner leads are exposed. By exposing the bottom of the die attach pad, mold delamination at the bottom of the die attach pad is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

According to Applicants' U.S. Pat. No. 6,498,099, the contents of which are incorporated herein by reference, a localized etch process is provided for the improved manufacture of the LPCC IC package. The leadframe strip is subjected to a partial etch on one or both of the top and bottom surfaces in order to create a pattern of contact leads (pads) and a die attach pad (paddle). This method of manufacture provides many advantages including contact pads that stand off from the remainder of the package.

In Applicants' own U.S. patent application Ser. No. 09/802,678, the contents of which are incorporated herein by reference, a plate-up process is used to form contact pads and a die attach pad. The unique plate-up process results in columnar shaped contact pads with a "mushroom cap" or rivet-shaped top for mold interlocking to provide superior board mount reliability.

Further improvements in integrated circuit packaging are still desirable and are driven by industry demands for increased thermal and electrical performance and decreased size and cost of manufacture.

SUMMARY OF THE INVENTION

According to one aspect of the present invention, there is provided a process for fabricating an integrated circuit package. At least a first side of a leadframe strip is selectively etched to define portions of a die attach pad and at least one row of contacts adjacent the die attach pad. A carrier strip is laminated to the first side of the leadframe strip and a second side of the leadframe strip is selectively etched to thereby define a remainder of the die attach pad and the at least one row of contacts. A semiconductor die is mounted to the die attach pad, on the second side of the leadframe strip and the semiconductor die is wire bonded to ones of the contacts. The second side of the leadframe strip is encapsulated, including the semiconductor die and wire bonds, in a molding material. The carrier strip is removed from the leadframe strip and the integrated circuit package is singulated from a remainder of the leadframe strip.

Advantageously, the unique etch-back process results in mold interlocking features for better board mount reliability. Also, the mold interlocking features are provided by an etch-back process that results in decreased cost of manufacture as compared to plate-up processes.

In one aspect, the package is manufactured using a carrier strip that is laminated to the leadframe strip. Advantageously, the carrier strip provides increased rigidity and support for the leadframe strip during manufacture. In another aspect, the contacts of the leadframe strip are electrically isolated by etching prior to mounting the semiconductor die to the die attach pad. This permits gang testing of the individual units of the strip prior to singulation. Advantageously, package handling and testing time is reduced.

BRIEF DESCRIPTION OF THE DRAWINGS

The present invention will be better understood with reference to the drawings and to the following description, in which:

FIGS. 1 to 11 show processing steps for fabricating an integrated circuit package in accordance with an embodiment of the present invention.

DETAILED DESCRIPTION OF THE PREFERRED EMBODIMENTS

Figure 10B:
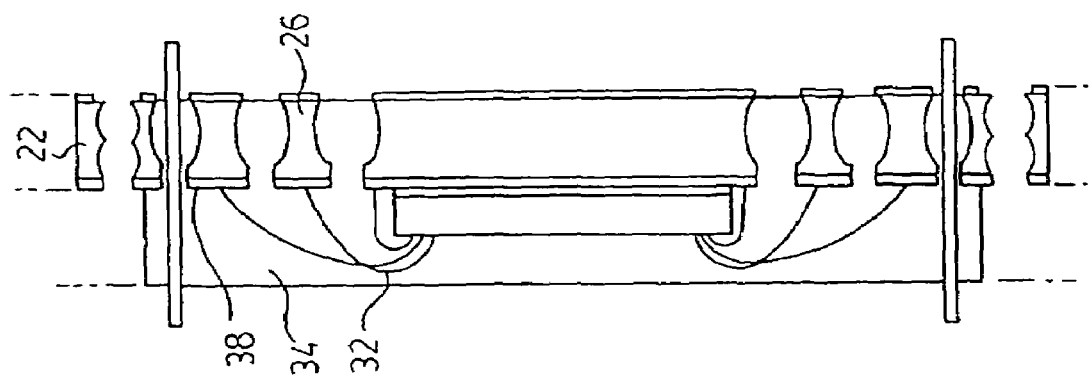
Figure 10A:
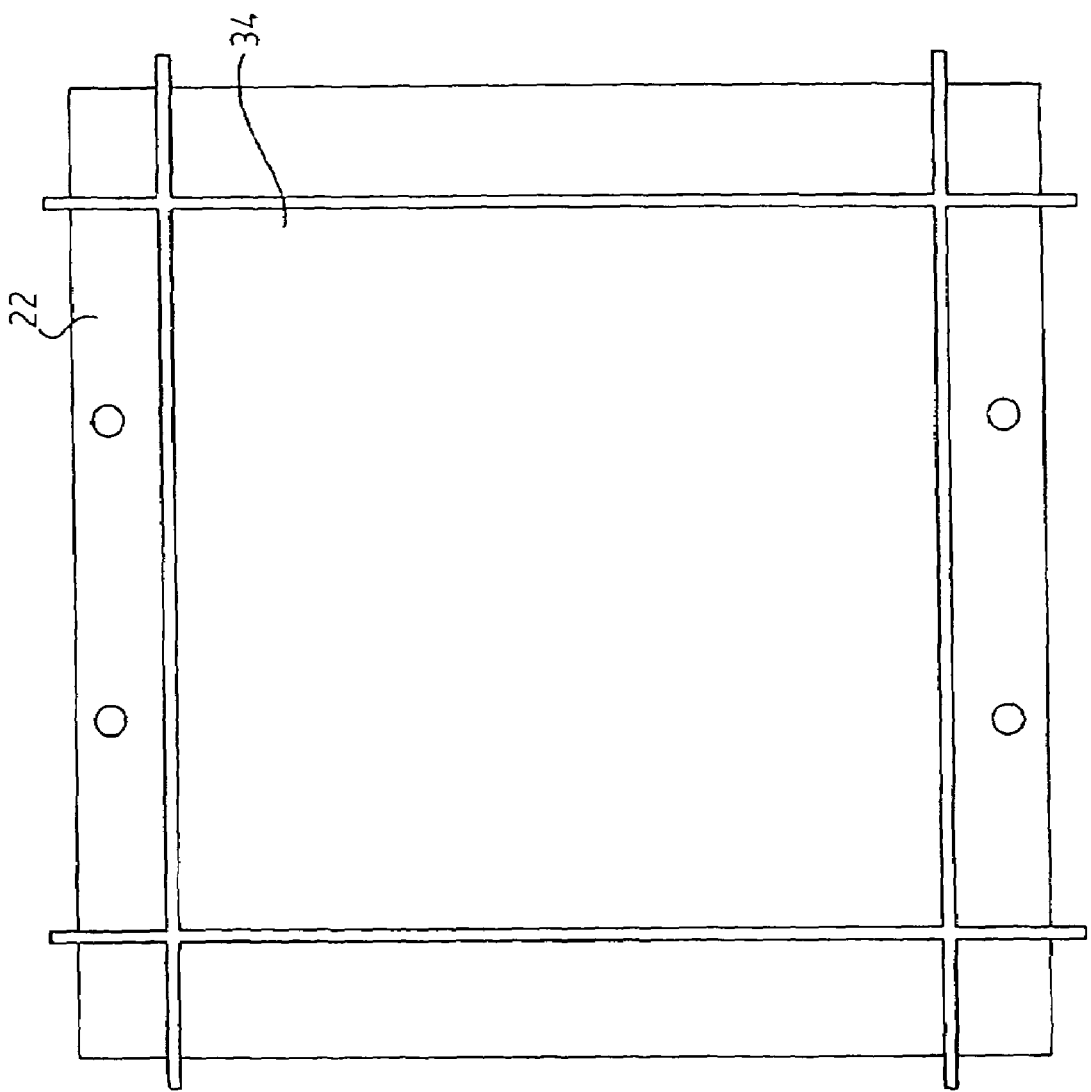
Figure 11:
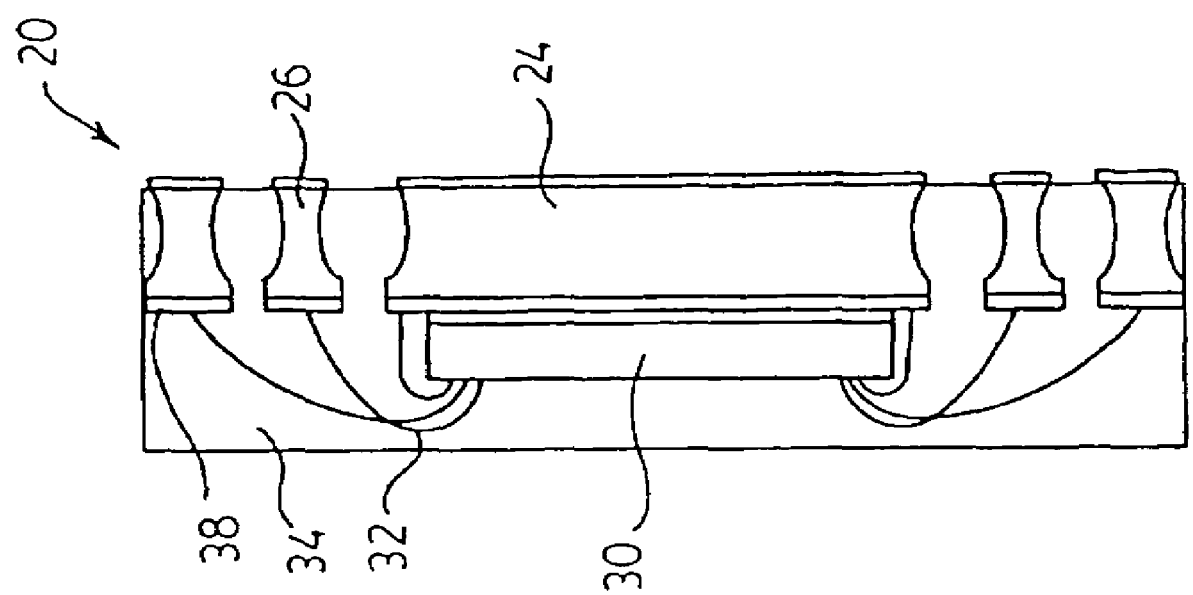

Reference is first made to FIGS. 1 to 11 to describe a process for fabricating an integrated circuit package, indicated generally in FIG. 11 by the numeral 20. The process includes selectively etching at least a first side of a leadframe strip 22 to define portions of a die attach pad 24 and at least one row of contacts 26 adjacent the die attach pad 24. A carrier strip 28 is laminated to the first side of the leadframe strip 22 and a second side of the leadframe strip 22 is selectively etched to thereby define a remainder of the die attach pad 24 and the at least one row of contacts 26. A semiconductor die 30 is mounted to the die attach pad 24, on the second side of the leadframe strip 22 and the semiconductor die 30 is wire bonded to ones of the contacts 26. The second side of the leadframe strip 22 is encapsulated, including the semiconductor die 30 and wire bonds 32, in a molding material 34. The carrier strip 28 is removed from the leadframe strip 22 and the integrated circuit package 20 is singulated from a remainder of the leadframe strip 22.

The process for fabricating the integrated circuit package 20 will now be further described with reference to the Figures. Referring first to FIGS. 1A and 1B, there is shown a top view and a partial sectional side view, respectively, of a copper (Cu) panel substrate which forms the raw material of the leadframe strip 22. As discussed in detail in Applicant's U.S. Pat. No. 6,229,200, the contents of which are incorporated herein by reference, the leadframe strip 100 is divided into a plurality of sections, each of which incorporates a plurality of leadframe units in an array (e.g. 3×3 array, 5×5 array, etc.) Only one portion of one such unit is depicted in the Figures, the remainder of the one unit and portions of adjacent units being indicated by stippled lines. It will be appreciated that the adjacent units of the leadframe strip are similar to the unit depicted. Reference is made to a single unit throughout the following description for the purpose of simplicity. It will be understood, however, that the process described is carried out in the fabrication of several units in the array.

Figure 2B:
Figure 2A:
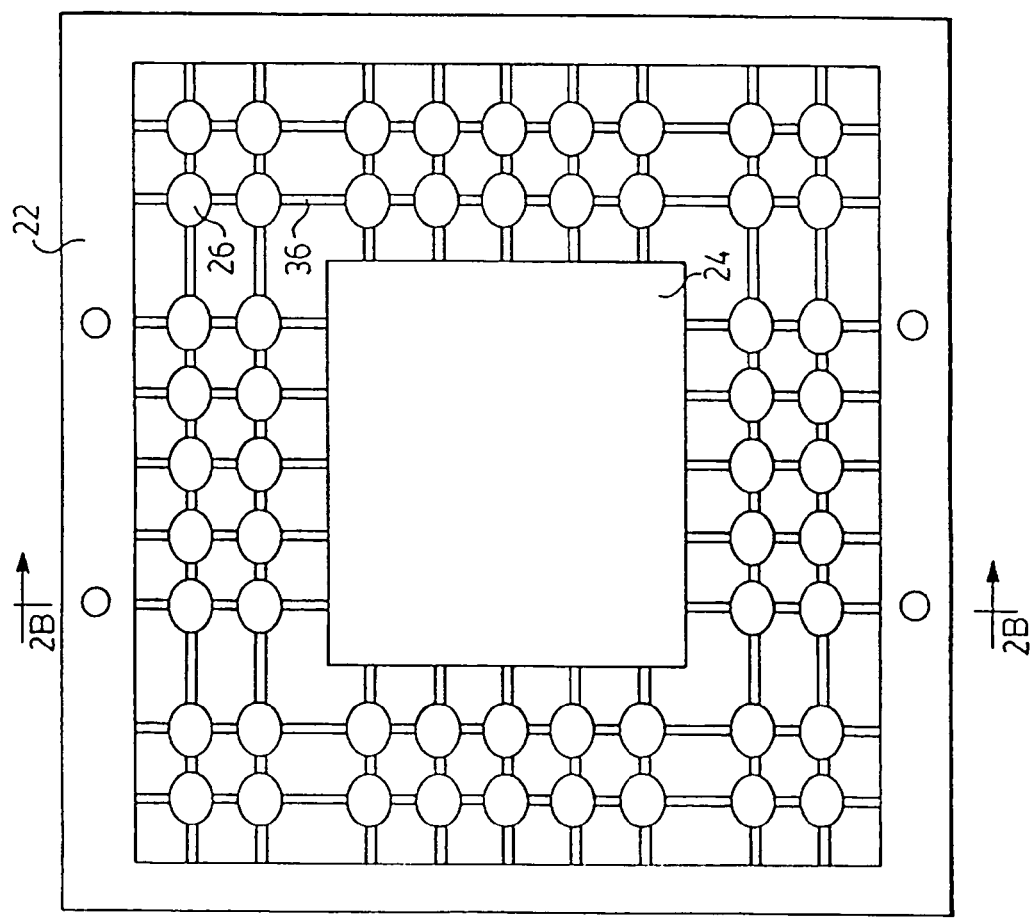

Referring to FIGS. 2A and 2B, a top view and a sectional side view of the leadframe strip 22 are shown in which, the first side of the leadframe strip 22 is selectively etched to partially define the die attach pad 24 and the contacts 26. The selective etch is carried out by coating the first and second sides of the leadframe strip 22 with a layer of photo-imageable etch resist such as photo-imageable epoxy. The etch resist is spin coated on the leadframe strip 22, selectively exposed with an ultraviolet light using a photo-tool, and the exposed portions are removed. The etch resist is thereby patterned to provide pits on the leadframe strip 22, in which selected portions of the leadframe strip 22 are exposed. The leadframe strip 22 is then immersion or pressurized spray etched to partially define the die attach pad 24 and the contacts 26 and the etch resist is stripped away using conventional means. In the present embodiment, the etch resist is also exposed at selected positions prior to etching, to provide tooling holes in the leadframe strip 22 after etching. The resulting leadframe strip 22 is shown in FIGS. 2A and 2B. In the present embodiment, two rows of contacts 26 that circumscribe the die attach pad 24, are formed.

As shown in FIG. 2B, curved undercut regions are created during etching to form the etched-down portions of the leadframe strip 22. These undercut regions act as mold interlocking features for mold compound adherence. Portions of the leadframe strip 22, on the etched-down portions, connect the partially defined die attach pad 24 and the contact pads 26 to the remainder of the leadframe strip 22 and thereby act as temporary tie bars 36 for holding the leadframe strip 22 together.

Figure 3B:
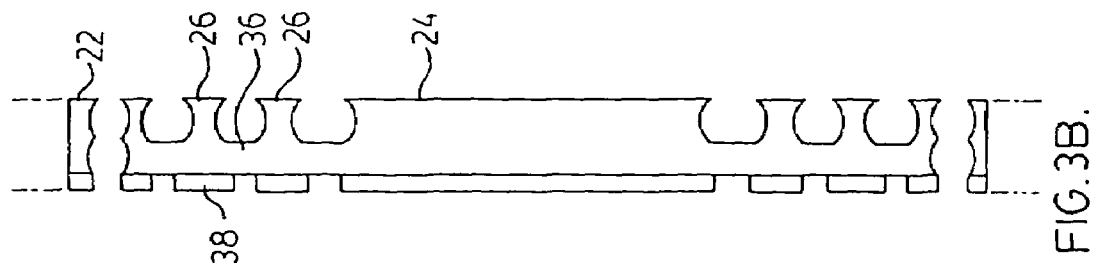
Figure 3A:
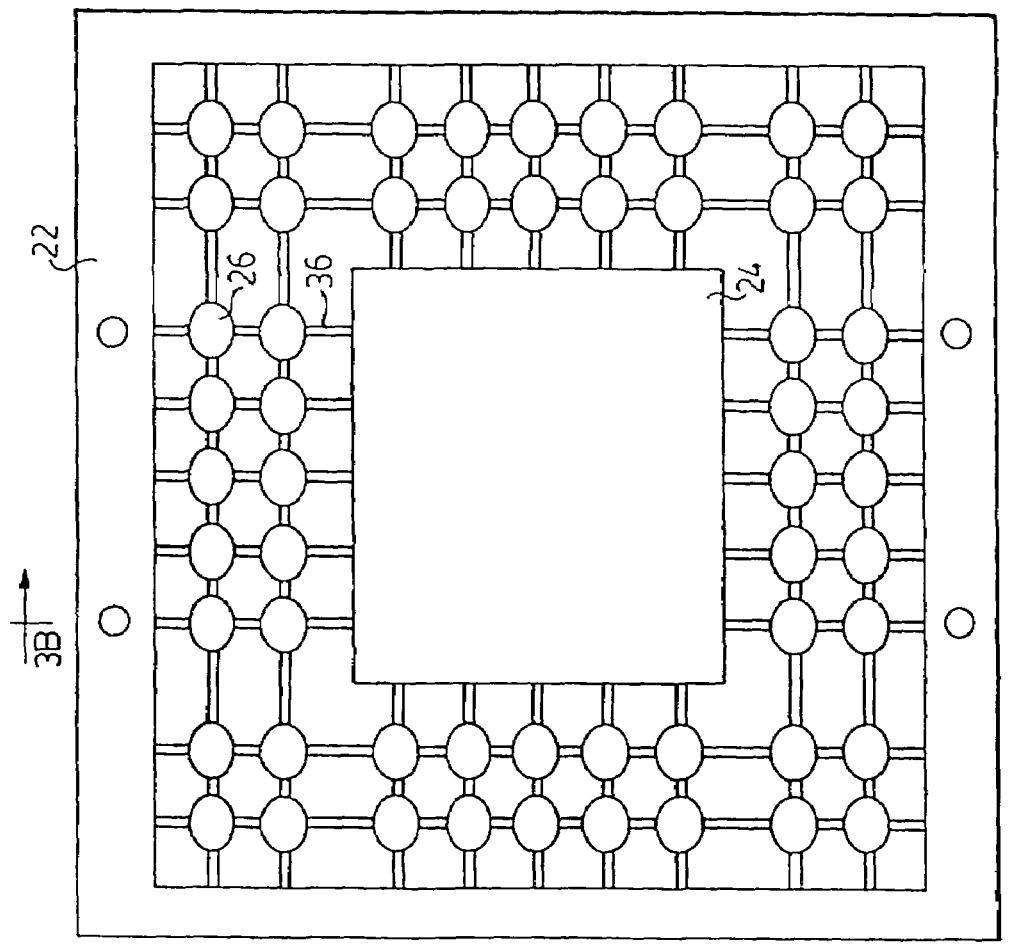

The second side of the leadframe strip 22 is then selectively plated with a metal 38 that permits wire bonding thereto and acts as an etch resistant layer, using known selective plating techniques (FIGS. 3A and 3B). Suitable plating metals include, for example, Silver (Ag), Nickel and Palladium (Ni/Pd) and Nickel and Gold (Ni/Au). As shown in FIGS. 3A and 3B, the selectively plated metal 38 is plated on the second side of the leadframe strip 22 to cover the die attach pad 24, the contacts 26, and peripheral portions of the package, around the tooling holes.

Next, the carrier strip 28 is prepared for laminating to the first side of the leadframe strip 22. The carrier strip 28 is made of any suitable metal, such as copper, and is plated with metal on both sides thereof, prior to lamination, as shown in the sectional side view of FIG. 4. The metal plating on the carrier strip 28 facilitates lamination of the carrier strip to the first side of the leadframe strip 22 and acts as an etch resist. Suitable plating materials include, for example, tin (Sn), solder, palladium (Pd), silver (Ag) and nickel then gold (Ni/Au). As shown in FIG. 4, the carrier strip 28 includes tooling holes for aligning with the tooling holes of the leadframe strip 22. The tooling holes of the carrier strip 28 are aligned with and are larger than the tooling holes of the leadframe strip 22, as shown.

Figure 5B:
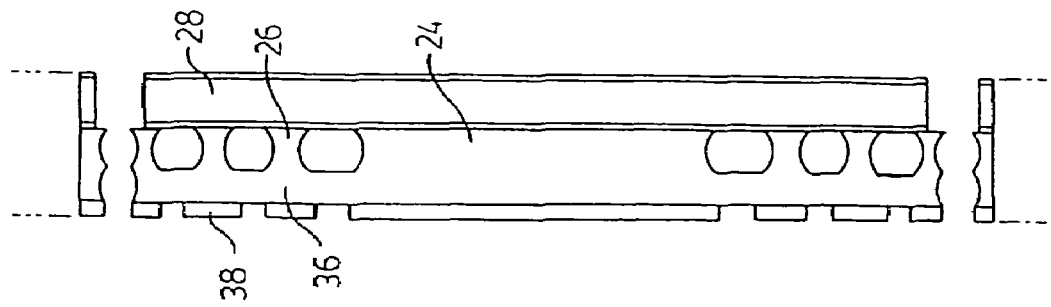
Figure 5A:
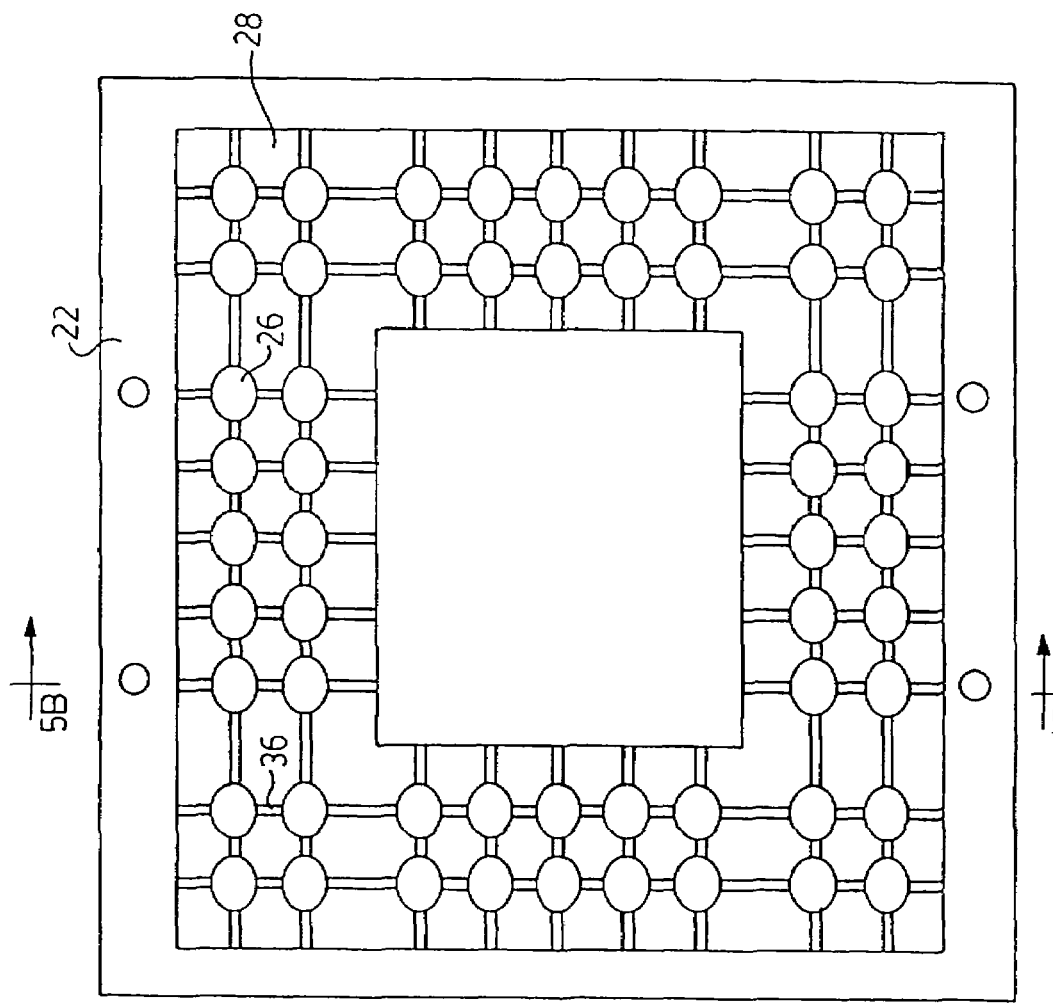

Referring to FIGS. 5A and 5B which show a top view and a sectional side view, respectively, of the leadframe strip 22, lamination of the carrier strip 28 to the first side of the leadframe strip 22 is carried out using suitable means such as using elevated temperature and pressure. Alternatively, lamination is carried out using an appropriate flux and solder reflow technique.

After lamination of the carrier strip 28 to the first side of the leadframe strip 22, the second side of the leadframe strip is selectively etched as shown in FIGS. 6A and 6B. Thus, exposed portions of the leadframe strip 22 that are not covered by the selectively plated metal 38 are subjected to a suitable etchant to define the remainder of the die attach pad 24 and the contacts 26. It will be apparent that the temporary tie bars 26 are etched away.

Figure 7B:
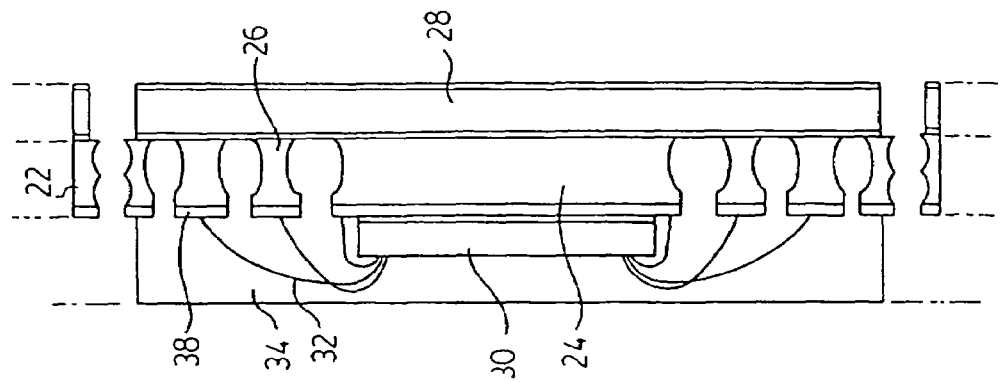
Figure 7A:
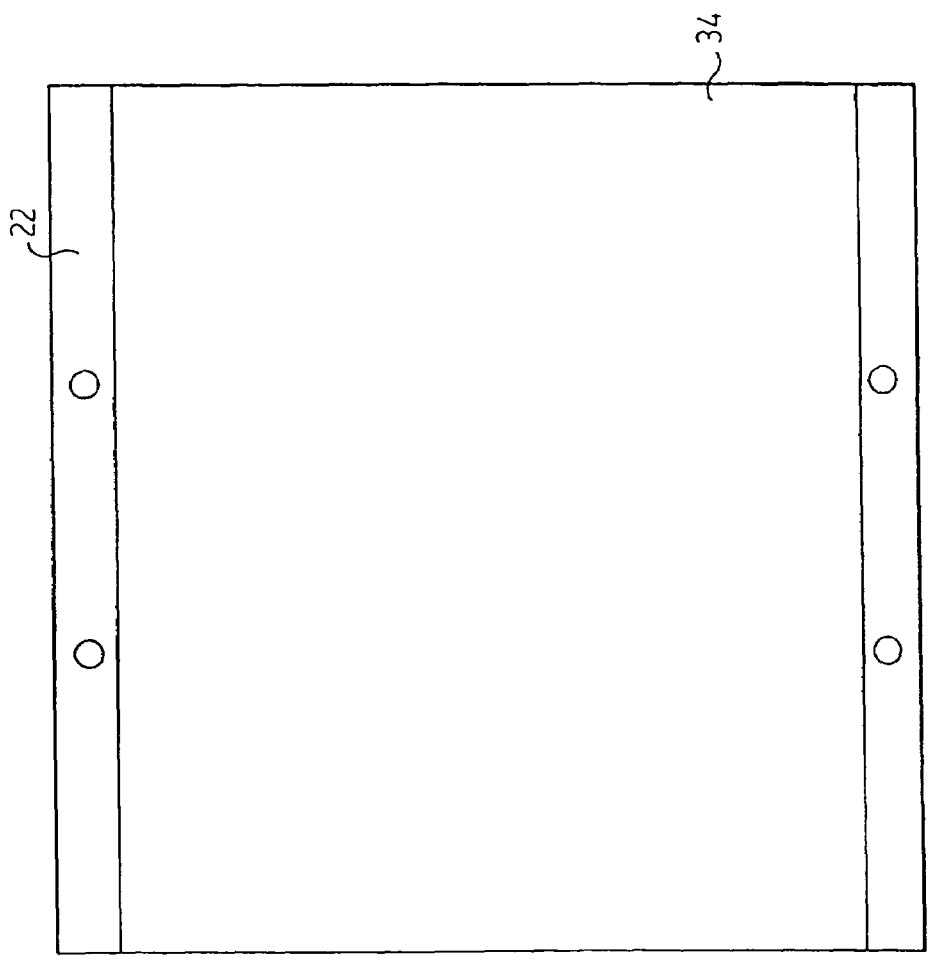

The semiconductor die 30 is conventionally mounted by, for example, epoxy or other suitable means, to the die attach pad 24, on the second side of the leadframe strip 22. Wire bonds 32 are then bonded between the semiconductor die 30 and the contacts 26. The leadframe strip 22 is then molded in the molding material 34 using a modified mold with a bottom cavity being a flat plate, and subsequently cured (FIGS. 7A and 7B). Thus, the second side of the leadframe strip 22, the semiconductor die 30 and the wire bonds 32 are encapsulated in the molding material 34, as shown.

Figure 8B:
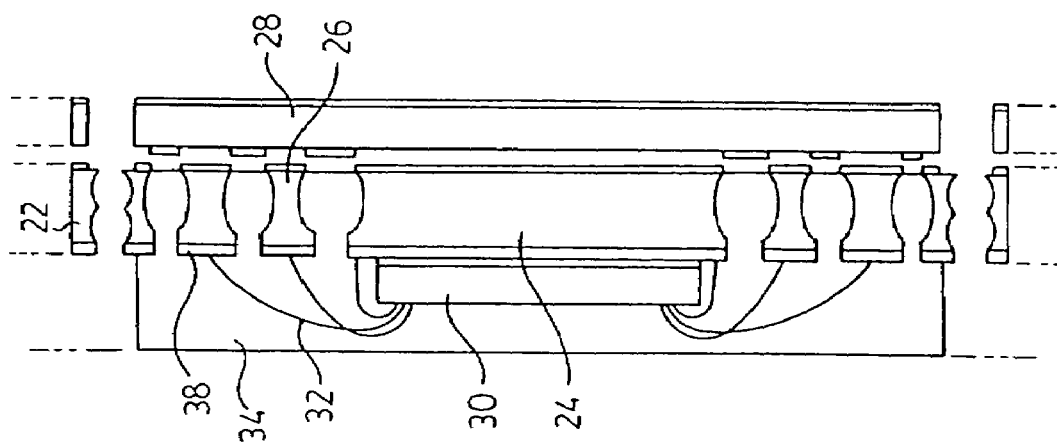
Figure 8A:
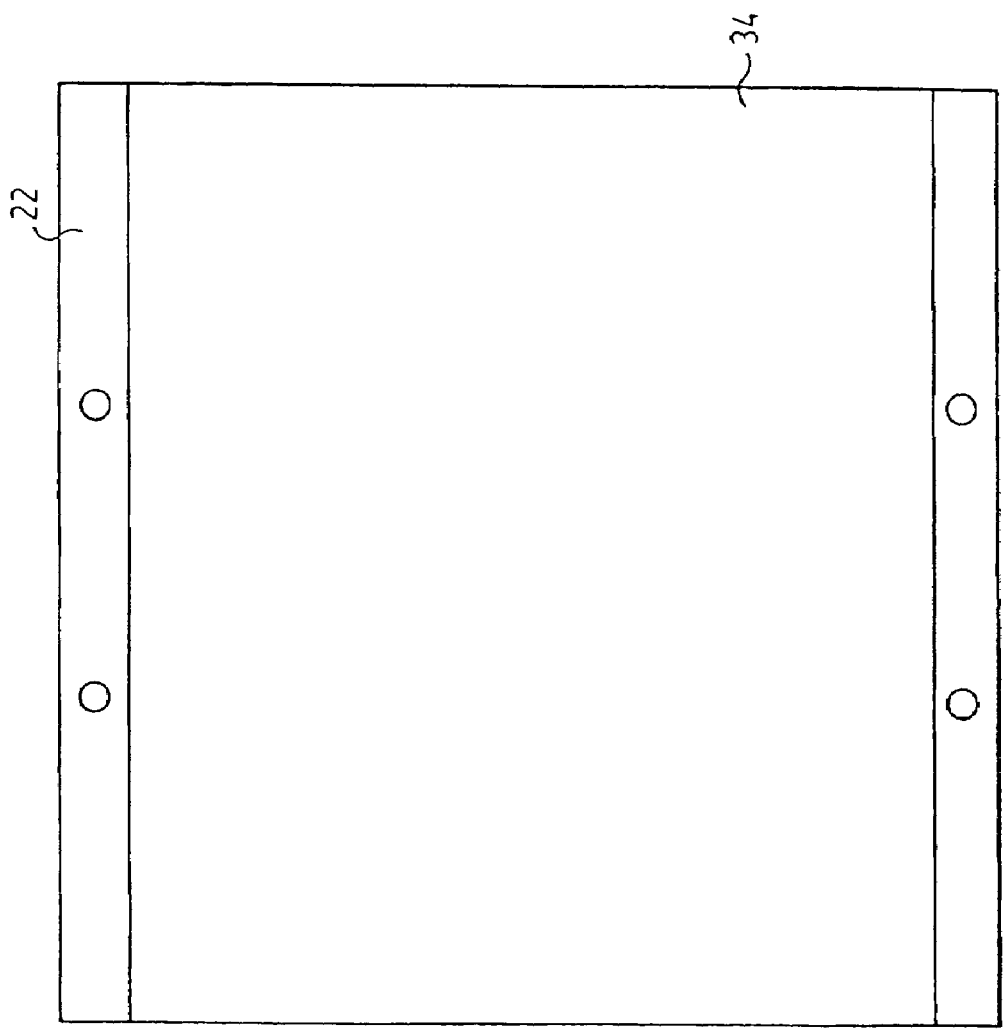

Next, the carrier strip 28 is removed from the first side of the leadframe strip 22 by heating and pulling the carrier strip 28 from the leadframe strip 22 (FIGS. 8A and 8B). As shown in FIG. 8B, upon removal of the carrier strip 28, metal plating from the carrier strip is left on the metal contacts 26 and die attach pad 24. Because the temporary tie bars 36 have been etched away (FIGS. 6A and 6B) and the carrier strip 28 is removed, the die attach pad 24 and the contacts 26 are electrically isolated.

Figure 9:
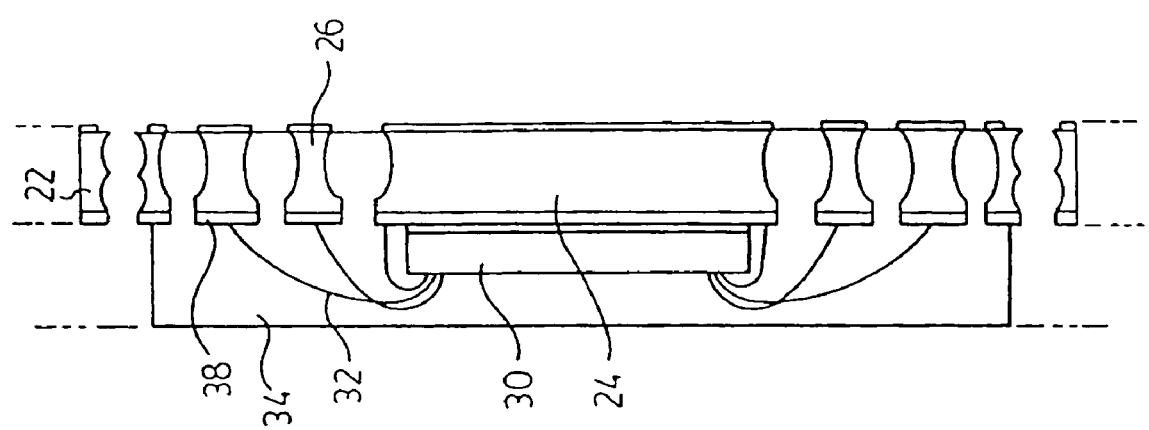

As stated above, the contacts 26 and die attach pad 24 are electrically isolated prior to singulating, thereby permitting gang testing of the individual units. Testing is then carried out on the unit prior to singulation (FIG. 9).

Singulation of the individual unit from the full leadframe strip 22 is then performed either by saw singulation or by die punching (FIGS. 10A and 10B). In the present embodiment, the individual unit is singulated by saw singulation, the cutting path of the cutting wheel saw being indicated in ghost outline in FIGS. 10A and 10B. Clearly a portion of the selectively etched leadframe that does not become part of the integrated circuit package 20 is saw singulated away, resulting in the integrated circuit package shown in the sectional side view of FIG. 11.

Figure 12B:
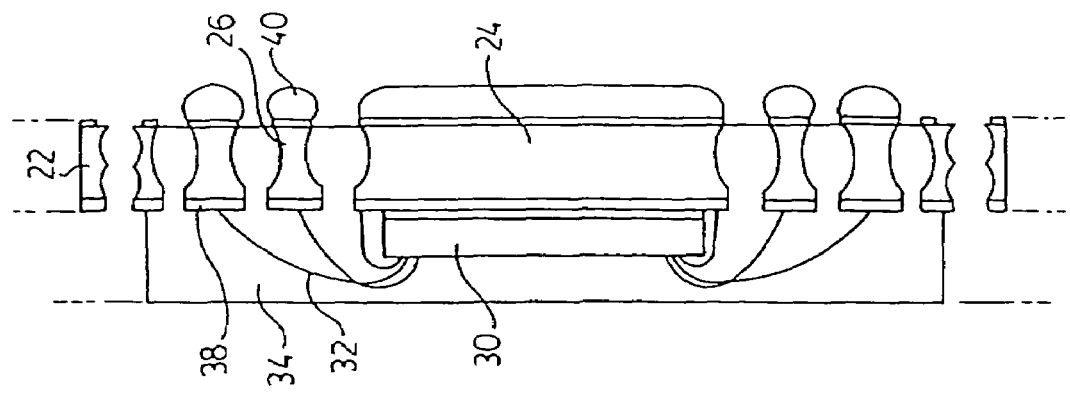
FIGS. 12A and 12B show an additional process step for fabricating an integrated circuit package in accordance with another embodiment of the present invention.
Figure 12A:
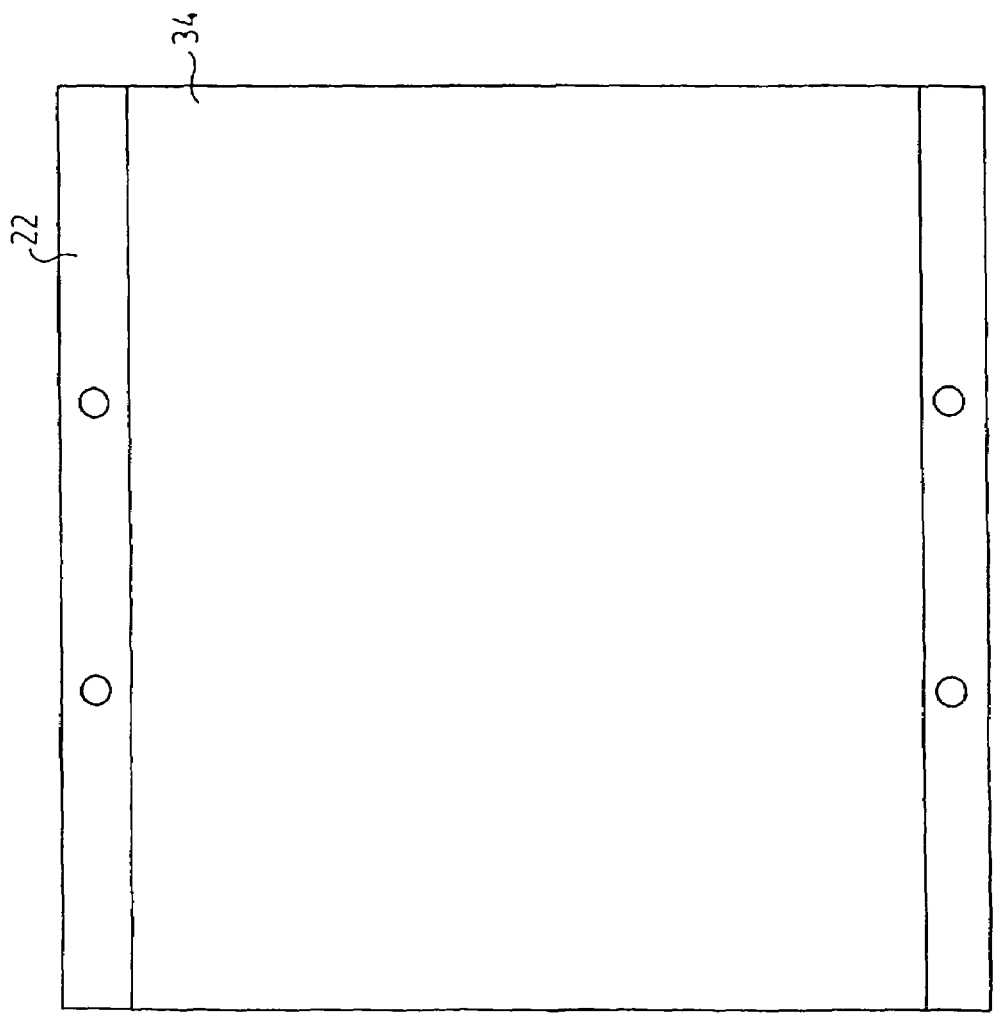

Alternatives and variations to the above-described process are possible. Reference is made to FIGS. 12A and 12B which show one alternative embodiment in which an additional step is carried out to mount a plurality of contact balls 40 on the first side of the leadframe strip 22, on the contacts 26 and the die attach pad 24. The contact balls 40 are mounted to the contacts 26 and the die attach pad 24 after the carrier strip 28 is removed from the first side of the leadframe strip 22 and prior to singulation of the individual unit from the full leadframe strip 22. To mount the contact balls 40 to the contacts 26, the contact balls 40, in the form of solder balls, are placed on the contacts 26 and the die attach pad 24 using known pick and place technique and reflowed using known reflow technique.

The present invention has been described by way of examples. Modifications and variations to the embodiments described herein may occur to those skilled in the art. For example, rather than using a pick and place technique, solder paste printing followed by known reflow technique is also possible. Other modifications and variations are also possible, all of which are within the sphere and scope of the present invention.

What is claimed is:

1. A process for fabricating an integrated circuit package, comprising:
   selectively etching at least a first side of a leadframe strip to define portions of a die attach pad and at least one row of contacts adjacent said die attach pad;
   laminating a carrier strip to said first side of said leadframe strip;
   selectively etching a second side of said leadframe strip to thereby define a remainder of said die attach pad and said at least one row of contacts;
   mounting a semiconductor die to said die attach pad, on the second side of the leadframe strip;
   wire bonding said semiconductor die to ones of said contacts;
   encapsulating said second side of said leadframe strip, including said semiconductor die and wire bonds, in a molding material;
   removing said carrier strip from said leadframe strip; and
   singulating said integrated circuit package from a remainder of said leadframe strip.

2. The process for fabricating the integrated circuit package according to claim 1, further comprising:
   plating said carrier strip for facilitating lamination, prior to laminating said carrier strip to said first side of said leadframe strip.

3. The process for fabricating the integrated circuit package according to claim 2, wherein said plating comprises plating metal on both sides of said carrier strip for facilitating lamination.

4. The process for fabricating the integrated circuit package according to claim 2, wherein said plating comprises plating one of Tin (Sn), Solder, Palladium (Pd), Silver (Ag) and layers of Nickel and Gold (Ni/Au) on said leadframe strip.

5. The process for fabricating the integrated circuit package according to claim 3, wherein said metal that is plated on both sides of said carrier strip, acts as an etch resistant layer.

6. The process for fabricating the integrated circuit package according to claim 1, wherein said selectively etching said second side of said leadframe strip comprises:
   selectively plating an etch-resistant metal on said second side of said leadframe strip; and
   etching said leadframe strip to thereby define said remainder of said die attach pad and said at least one row of contacts.

7. The process for fabricating the integrated circuit package according to claim 1, wherein said selectively etching said first side of said leadframe strip comprises:
   depositing a photo-imageable etch-resistant mask on said first side of said leadframe strip;
   imaging and developing said mask to expose portions of said first side of said leadframe strip; and
   etching said first side of said leadframe strip to thereby etch said exposed portions of said first side of said leadframe strip.

8. The process for fabricating the integrated circuit package according to claim 1, wherein said laminating said carrier strip to said first side of said leadframe strip comprises laminating at elevated temperature and pressure.

9. The process for fabricating the integrated circuit package according to claim 1, wherein said laminating said carrier strip to said first side of said leadframe strip comprises laminating using solder reflow technique.

10. The process for fabricating the integrated circuit package according to claim 1, wherein said removing said carrier strip comprises:
    heating the laminated strip and pulling said carrier strip from said leadframe strip.

11. The process for fabricating the integrated circuit package according to claim 1, further comprising:
    mounting a plurality of contact balls on said first side of said leadframe strip, in the form of a ball grid array, ones of said contact balls being electrically connected to ones of said contacts, after removing said carrier strip and prior to singulating.

12. The process for fabricating the integrated circuit package according to claim 1, further comprising solder reflowing after removing the carrier strip.

13. The process for fabricating the integrated circuit package according to claim 1, wherein the carrier strip is a metal strip.

14. The process for fabricating the integrated circuit package according to claim 1, further comprising gang testing individual units of the leadframe strip prior to singulating said integrated circuit package.

* * * * *